United States Patent
Su et al.

(10) Patent No.: US 6,348,382 B1
(45) Date of Patent: Feb. 19, 2002

(54) INTEGRATION PROCESS TO INCREASE HIGH VOLTAGE BREAKDOWN PERFORMANCE

(75) Inventors: Hung-Der Su, Kao-Hsiung; Chrong Jung Lin; Jong Chen, both of Taipei; Wen-Ting Chu, Kaoushiung Country, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/392,391

(22) Filed: Sep. 9, 1999

(51) Int. Cl.[7] .......................................... H01L 21/8234
(52) U.S. Cl. ....................................... 438/275; 438/199
(58) Field of Search ................................ 438/142, 197, 438/199, 275 A

(56) References Cited

U.S. PATENT DOCUMENTS

| | | | | |
|---|---|---|---|---|
| 4,470,852 A | * | 9/1984 | Ellsworth | 148/1.5 |
| 5,024,960 A | | 6/1991 | Haken | 437/34 |
| 5,204,541 A | * | 4/1993 | Smayling et al. | 257/138 |
| 5,254,487 A | * | 10/1993 | Tamagawa | 438/217 |
| 5,366,916 A | | 11/1994 | Summe et al. | 437/44 |
| 5,498,554 A | | 3/1996 | Mei | 437/34 |
| 5,502,009 A | * | 3/1996 | Lin | 438/275 |
| 5,527,722 A | * | 6/1996 | Hutter et al. | 438/231 |
| 5,872,030 A | * | 2/1999 | Huang | 438/210 |
| 6,033,958 A | * | 3/2000 | Chou et al. | 438/275 |

* cited by examiner

Primary Examiner—John F. Neibling
Assistant Examiner—Christopher Lattin
(74) Attorney, Agent, or Firm—George O. Saile; Stephen B. Ackerman

(57) ABSTRACT

A new process is provided whereby LDD regions for HV CMOS devices and for LV CMOS devices are created using one processing sequence. The gate electrodes for both the High Voltage and the Low Voltage devices are created on the surface of a silicon substrate. The High Voltage LDD (HVLDD) is performed self-aligned with the HV CMOS gate electrode, a gate anneal is performed for both the HV and the LV CMOS devices. The Low Voltage LDD (LVLDD) is performed self-aligned with the LV CMOS gate electrodes. The gate electrodes of the CMOS devices are after this completed with the formation of the gate spacers, the source/drain implants and the back-end processing that is required for CMOS devices.

20 Claims, 2 Drawing Sheets

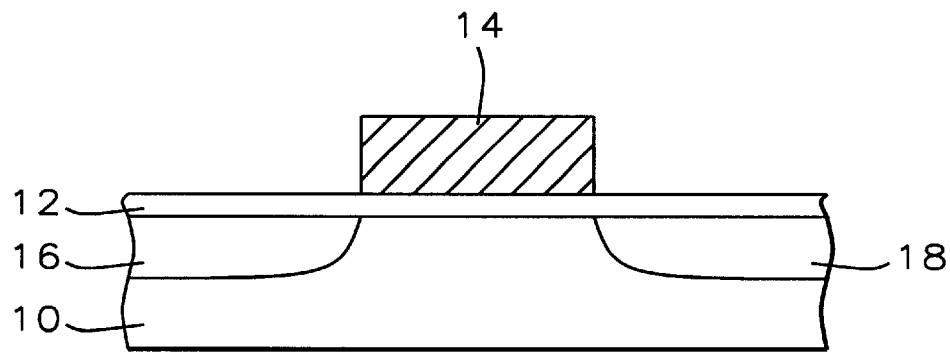
FIG. 1a – Prior Art
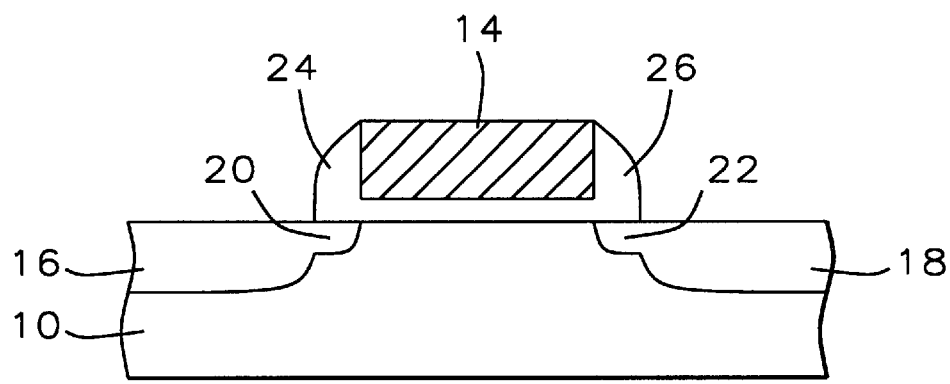
FIG. 1b – Prior Art

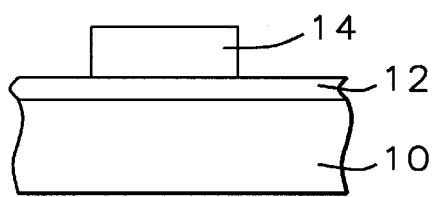
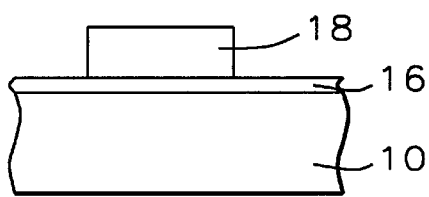
FIG. 2a   FIG. 2b
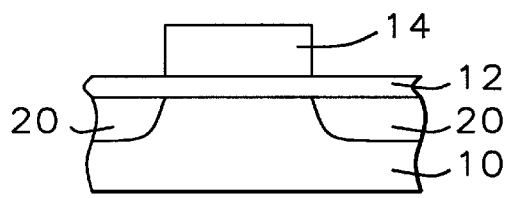
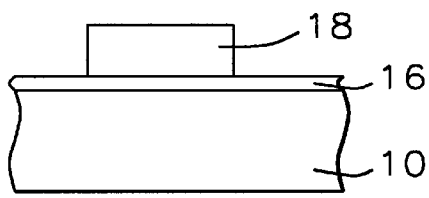
FIG. 3a   FIG. 3b
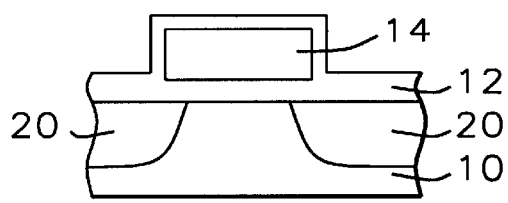
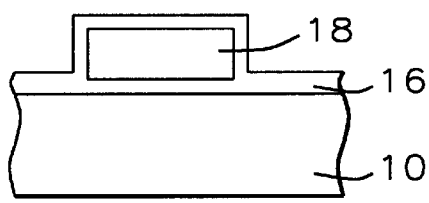
FIG. 4a   FIG. 4b
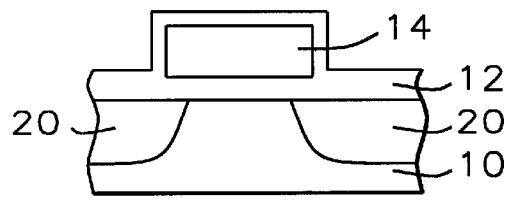
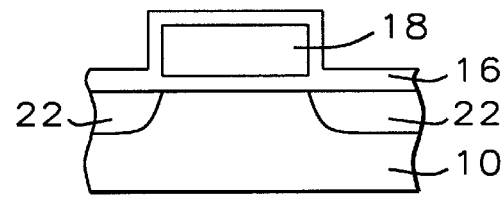
FIG. 5a   FIG. 5b

INTEGRATION PROCESS TO INCREASE HIGH VOLTAGE BREAKDOWN PERFORMANCE

BACKGROUND OF THE INVENTION

(1) Field of the Invention

The invention relates to the fabrication of integrated circuit devices, and more particularly, to a method of performing Lightly Doped Drain (LDD) implants for High Voltage (HV) and for Low Voltage (LV) polysilicon gate electrodes using one processing sequence thereby enabling the creation of devices that contain both HV and LV polysilicon gate electrodes.

(2) Description of the Prior Art

The continuing striving of the semiconductor industry to reduce device manufacturing costs has been accompanied by a simultaneous emphasis on improving device performance. These objectives have been met in the industry by the continued improvements of a number of interrelated technical disciplines. Key among these disciplines are photolithography and the innovative application of materials combined with new methods of applying processing parameters and processing sequences that are used to create the device features and semiconductor devices. Critical to device performance improvements is the reduction of device dimensions. As an example, the performance of typical Metal Oxide Field Effect Transistors (MOSFET) is critically dependent on the dimensions of the gate electrode that is used in the creation of MOSFET devices. This requirement of creating narrow gate features is closely coupled with the process of photolithography that is used in the creation of the gate electrode. The reduction of gate electrode gate size has been made possible by a confluence of improvements in photolithography (allowing for greater image resolution), in improved photoresist material and in the development of high contrast photoresist material.

Improved etching techniques such as Reactive Ion Etching (RIE) have also contributed to the creation of deep sub-micron device features. With improvements in photo-imaging techniques and advancements in exposure methods, the wavelengths of the exposure sources now reach into the Deep Ultra Violet range. Special techniques such as the application of special layers of material further improve focusing depth and sharpness of focus in creating images in for instance layers of photoresist that are applied to create interconnect lines, vias, contact openings and the like. These techniques are equally applied in the formation of for instance Complementary Metal Oxide Semiconductor (CMOS) devices.

The technique of creating complementary n-channel and p-channel devices has long been known and applied in the semiconductor industry. The salient advantage of these devices is their low power usage due to the fact that two transistors are paired as complementary n-channel and p-channel transistors whereby in either logic state (on/off) of the device, one of the two transistors is off and negligible current is carried through this transistor. The logic elements of Complementary Metal Oxide devices drain significant amounts of current only at the time that these devices switch from one state to another state. Between these transitions the devices draw very little current resulting in low power dissipation for the CMOS device.

The invention addresses an improved method of concurrently creating Lightly Doped Drain (LDD) regions in both high voltage and low voltage CMOS devices, following will therefore be a brief overview of present methods of forming these devices.

A typical n-channel transistor for a CMOS inverter is formed by first forming a p-region (also called tub or well) in the surface of an n-type silicon substrate. Referring to FIG. 1a, there is shown a cross section of a typical MOS transistor that is formed on the surface of a silicon substrate 10. A layer 12 of gate oxide is first formed over the surface of the substrate 10, this layer 12 of oxide serves as a stress relieve layer between the gate of the MOS transistor and the silicon surface. A layer of polysilicon or the like is deposited over the layer of gate oxide 12 and patterned and etched to form the structure 14 of the gate electrode. Source and drain regions (16 and 18 respectively) are then formed self-aligned with and adjacent to the gate electrode 14 by implanting of high-concentration n-type impurities into the surface of the silicon substrate 10. In the era of ULSI devices, the width of the gate has been reduced to below 0.5 um, the distance between the source and the drain region (the channel length) is correspondingly reduced. This sharp reduction in channel length however leads to a significant increase in the concentration of the electromagnetic field close to drain region 18 where this drain region interfaces with the underlying silicon substrate 10. This sharp increase may lead to leakage current between the drain region 18 and the surrounding silicon of substrate 10. In addition, hot carriers can be created in the silicon of the substrate 10 and can gain sufficient energy to penetrate into the layer of gate oxide 12 underneath the gate structure 14 resulting in impacting the threshold voltage between the gate 14 and the substrate 10. This may lead to current flow between the gate electrode 14 and the underlying substrate 10.

To counteract the increase in the electric field, the art has implemented the formation of Lightly Doped Drain (LDD) regions 20 and 22 that are shown in FIG. 1b. The LDD regions 20 and 22 form double off-set regions whereby the source and drain regions now contain high n-type impurity concentrations 16 and 18 and low n-type impurity concentrations 20 and 22. The principle objective of the LDD regions 20 and 22 is to offset the high concentration of the electric field around the drain region 18. The regions are symmetrically formed around the gate electrode and consist of low-concentrations of n-type impurities 20 and 22. The profile of the implanted regions 20 and 22 indicates that the impurity concentrations in the p-n junction change gradually thereby extending to the source and drain regions to attenuate the electric field.

With the creation of the LDD regions 20 and 22, the breakdown between the drain region 18 and the channel region between the source and the drain region has been eliminated. Hot carriers that could affect the threshold voltage are thereby also eliminated. However, the low concentration regions 20 and 22 form high resistivity regions by their nature of being low concentration impurity regions. Since the current flows between the source and drain regions, the regions 20 and 22 are now parasitic resistances that are connected in series between the source and the drain regions. This lowers the drain current and the n-resistance performance of the transistor thereby reducing the performance of the device. Sidewalls 24 and 26 of the gate electrode structure 14 that have been formed on the surfaces of the low-concentration n-source and drain regions further emphasizing this effect. The high electric field that is in effect around the drain region 18 generates hot carriers, some of these carriers may be injected into the lower portion of the sidewall 26 of the drain region 18. The region of the silicon surface of the n-type impurity 22 becomes depleted of carriers due to the electric field that is created by the hot carriers that have become trapped in the underlying layer of gate oxide 12. This results in an increase of the threshold voltage of the transistor thereby having a negative effect on the drain characteristics and ultimately on the reliability of the transistor.

The CMOS device can be divided into a low voltage transistor with operating voltages of no larger than about six volts or a high voltage transistor with an operating voltage in excess of thirteen volts. Low voltage transistors are generally used at the logic or intermediate stages of signal processing while high voltage transistors are generally used as current drivers and switches or as serving at input and output stages of the integrated circuit.

The doping for the formation of regions 20 and 22 is typically performed after the gate spacers 26 have been formed by the process of annealing. The implant for the LDD regions can be, dependent on device type, be a Low Voltage LDD (LVLDD) or a High Voltage LDD (HVLDD). The polysilicon gate electrode is, as part of the creation of the gate, doped in order to establish the desired level of electrical conductivity. It is a requirement that this doping is evenly distributed throughout the body of the gate electrode, which requires that the thickness of the gate electrode be reduced. This brings with it a reduction of the implant energy that can be used to create the LDD regions since too high an implant energy would result in implanted ions penetrating the gate electrode into the underlying silicon of the substrate thereby having a negative effect on the breakdown voltage of the device and on the device functionality. A gate electrode that is reduced in thickness results in reduced implant energy for the HVLDD which results in shallow implants in the LDD regions which in turn results in low breakdown voltage of the high voltage MOS devices.

Since the above-indicated high voltage transistors and the low voltage transistors operate in conjunction with each other, it is often desirable to fabricate these devices on the same substrate. A characteristic of the high voltage device is however that it requires a channel region between the source and the drain regions of the device that can withstand a relatively high induced electric field without experiencing avalanche breakdown whereby excessive currents are created due to the formation of electron hole pairs by the electric field. The result is that high and low voltage transistors frequently have different internal dimensions and that they are frequently formed using different processing sequences. This has in the past led to the formation of high and low voltage transistors on different chips. Required in the creation of high and low voltage transistors is large breakdown voltages (in excess of 13 volts, suitable for current drivers), low source to drain channel resistance, low ionization, low levels of electrical fields around the various areas of dopant implants and low leakage currents.

In a typical High voltage/Low voltage CMOS transistor configuration, HV NMOS, LV NMOS, HV PMOS and LV PMOS can be created on the surface of a substrate. The fabrication of these devices typically applies multiple processing steps that are required to optimize the electrical parameters of the HV N-channel and the P-channel devices while maintaining the desired performance parameters of the LV CMOS devices. Any reduction or simplification in these processing steps is therefore highly desirable and contributes to making these devices more competitive and more widely used.

The above indicated problems in the fabrication of CMOS transistors leads to a requirement for alternate methods of creating these devices, methods that counteract the shallow high voltage junction and the resulting low breakdown voltages of the high voltage MOS device. This requirement takes on increased urgency for devices with micron and sub-micron device features where the impact of low breakdown voltage is only further emphasized.

U.S. Pat. No. 5,366,916 (Summe et al.) shows a method for a HV device.

U.S. Pat. No. 5,498,554 (Mei) shows a HV Device with high doping at surface and low doping a bottom junction.

U.S. Pat. No. 5,024,960 (Haken) shows a dual LDD submicron CMOS process for making low and high voltage transistors with common gate.

SUMMARY OF THE INVENTION

A principle objective of the invention is to provide an improved method for simultaneously creating Lightly Doped Drain (LDD) regions for High Voltage and Low Voltage CMOS gate electrodes.

Another objective of the invention is to offset the effect of shallow junction depth for High Voltage CMOS devices thereby reducing potential problems of low breakdown voltage for High Voltage CMOS devices.

Yet another objective of the invention is to simultaneously achieve high breakdown voltage for CMOS devices having HVLDD regions and shallow low voltage junctions for CMOS devices having LVLDD regions.

In accordance with the objectives of the invention a new process is provided whereby LDD regions for HV CMOS devices and for LV CMOS devices are created using one processing sequence. CMOS generally refers to any integrated circuit in which both N-channel and P-channel Metal Oxide Semiconductor Field Effect Transistors (MOSFETS) are used in complementary fashion. The gate electrodes of the invention for both the High Voltage and the Low Voltage devices are created on the surface of a silicon substrate. The High Voltage LDD (HVLDD) is implanted self-aligned with the HV CMOS gate electrode. A gate anneal is performed for both the HV and the LV CMOS devices. The Low Voltage LDD (LVLDD) is implanted self-aligned with the LV CMOS gate electrode. The gate electrodes of the CMOS devices are after this completed with the formation of the gate spacers, the source/drain implants and the back-end processing that is required for CMOS devices.

BRIEF DESCRIPTION OF THE DRAWINGS

FIG. 1 shows a cross section of the Prior Art gate electrode, as follows:

FIG. 1a shows a cross section of a substrate on the surface of which has been formed a gate electrode with the completion of the implants for the source and drain regions.

FIG. 1b shows a cross section of the substrate after the LDD regions of the source/drain regions have been formed in addition to the formation of the gate spacers.

FIG. 2a shows a cross section of a substrate on the surface of which has been created a layer of gate oxide and a polysilicon gate structure, this for a High Voltage device.

FIG. 2b shows a cross section of a substrate on the surface of which has been created a layer of gate oxide and a polysilicon gate structure, this for a Low Voltage device.

FIG. 3a shows a cross section of the HV device after the HVLDD implant has been completed.

FIG. 3b shows a cross section of the LV device after the HVLDD implant has been completed. This implant does not affect the LV device.

FIG. 4a shows a cross-section of the HV device after the gate anneal has been completed.

FIG. 4b shows a cross-section of the LV device after the gate anneal has been completed.

FIG. 5a shows a cross section of the HV device after the LVLDD implant has been completed. This implant does not affect the HV device.

FIG. 5b shows a cross section of the LV device after the LVLDD implant has been completed.

DESCRIPTION OF THE PREFERRED EMBODIMENTS

In conventional processing to create CMOS devices, specifically during the creation of High Voltage LDD regions, the gate anneal process is performed prior to performing the HVLDD implant. This results in a shallow high voltage junction due to the fact that the annealed gate oxide (partially) blocks the HVLDD implant. As a result, the (HVLDD) CMOS device has a relatively low breakdown voltage. The invention addresses this problem and provides a method whereby the breakdown voltage performance of the (HVLDD) device is considerably improved.

The invention provides a process whereby the HVLDD implant is performed prior to performing the gate anneal. The HVLDD is further driven into the surface of the substrate during the gate anneal processing step thereby forming a deep and graded junction between the HVLDD region and the surrounding substrate. The result is that the breakdown voltage of the HVLDD device is improved. Furthermore, the layer of gate oxide prevents the HVLDD diffusion from penetrating into the channel region of the HV gate electrode during the gate anneal process thereby increasing the threshold voltage of the HV device. By performing the LVLDD implant after the gate anneal, a desired shallow junction depth is established for the LV device.

The invention therefore provides a process whereby the HVLDD (for HV CMOS devices) and the LVLDD (for LV CMOS devices) can be created simultaneously and whereby both types of the devices have the desired performance characteristics, that is:

high breakdown voltage for the HV device high threshold voltage for the HV device, and shallow LDD junction depth for the LV device.

In the following sequence of cross sections, the cross sections that are shown under FIGS. 2a, 3a, 4a and 5a refer to High Voltage (HV) gate electrode structures while the cross sections that are shown under FIGS. 2b, 3b, 4b and 5b refer to Low Voltage (LV) gate electrode structures.

Referring now specifically to FIG. 2a, there is shown a cross section of a semiconductor substrate 10, a layer 12 of gate oxide is deposited over the surface of the substrate 10 while a HV polysilicon gate 14 has been formed overlying the gate oxide.

The silicon substrate 10 is typically composed of P-type, single crystalline silicon with a <100> orientation. Field Oxide (FOX) regions (not shown) are formed for isolation purposes separating P-channel regions (for PFET's) from the N-channel regions (for NFET's). The FOX region can be created by initially growing a thin layer of silicon oxide using thermal processing and than depositing a layer of silicon nitride. The layer of silicon nitride can be deposited using Low Pressure CVD (LPCVD) of Plasma Enhanced CVD (PECVD) processing. Subsequent steps of photolithography and Reactive Ion Etching (RIE) create the desired pattern in the (oxidation resistant) layer of silicon nitride/silicon dioxide. The layer of photoresist is removed (using plasma oxygen ashing and careful wet cleans) and the FOX layer is thermally grown in an oxygen steam ambient. The layer of FOX is typically between 3000 and 5000 Angstrom thick in the unprotected regions. The layer of silicon nitride is next removed in a hot phosphoric acid solution. P- and N-well regions can than be created in the surface of the substrate by photoresist patterning and respectively blocking either the P-well region or the N-well region. The N-well/PFET region (the P-well region is now blocked by photoresist) can be created by implanting an N-type dopant such as phosphorous at an energy between about 300 and 800 KeV and a dose between about 5E12 and 1E13 atoms/cm$^2$. The P-well/NFET region (the N-well region is now blocked by photoresist) can be created by implanting a P-type dopant such as indium or boron at an energy between about 130 and 180 KeV and a dose between about 5E12 and 7E12 atoms/cm$^2$. The layers of photoresist and silicon dioxide are removed (the photoresist with plasma oxygen ashing, the layer of silicon oxide using a diluted hydrofluoride acid solution consisting of 50 parts H$_2$O and one part HF).

The substrate is now ready for the creation of the layer 12 of gate oxide. This layer typically contains silicon dioxide and is thermally grown in an oxygen—steam ambient at a temperature between about 800 and 1000 degrees C., typically to a thickness between about 30 and 300 Angstrom. The poly gates 14 are created by the deposition of a layer of polysilicon using LPCVD processing at a temperature between about 500 and 650 degrees C. to a thickness between about 1500 and 4000 Angstrom. The layer of polysilicon can be grown using in-situ doping procedures, via incorporation of arsine or phosphine, to a silane ambient. The layer of polysilicon can also be grown intrinsically and doped using a N-type dopant such as arsenic or phosphorous at an energy of between about 30 and 75 KeV and a dose of between about 5E14 and 1E16 atoms/cm$^2$. The gate structure is etched using photolithography and RIE processing using SF$_6$ and Cl$_2$ as etchants.

The layer 12 of gate oxide for the HV device of FIG. 2a is grown to a thickness of between 150 and 400 Angstrom in order top provide extra protection during the process of HVLDD implant. In contrast, the layer of gate oxide 16 that is shown in FIG. 2b for the LV device is grown to a thickness of between about 15 and 100 Angstrom since this layer does not need to provide extra protection during the LVLDD implant.

The difference in thickness between the two layers of gate oxide that is indicated above is achieved as follows:

the thick layer of oxide is grown a layer of photoresist is used to protect the thick part of the layer of oxide the thin oxide part is etched using HF or BEO the photoresist is removed, and the thin oxide is grown.

FIG. 2b shows a cross section of the silicon substrate 10 on the surface of which a layer 16 of gate oxide has been deposited. A LV poly gate 18 has been created overlying the layer 16 of gate oxide. The creation of both the layer 16 and the gate structure 18 follow the same procedures as high-lighted above under FIG. 2a and will therefore not be further addressed under FIG. 2b.

FIG. 3a shows a cross section of the substrate for the HV device after the HVLDD implant 20 has been completed. Typical LDD implant processing conditions are as follows.

For the P-channel FET: implant p-type dopant species such as BF$_2$, for instance at a dose of between about 1.0E13 and 5.0E13 atoms/cm$^2$ and at an implant energy between about 40 and 60 KeV. For the N-channel FET: implant n-type dopant species such arsenic or phosphorous, for instance at a dose of between about 1.0E13 and 1.0E14 atoms/cm$^2$ and at an implant energy between about 30 and 80 KeV.

LDD implant processing condition can vary and depend on device design requirements. For instance, other frequently used implant processing conditions for NMOS/PMOS devices are as follows:

LDD implant for a NMOS device using arsenic with an energy within the range of between 1 to 10 keV and a dose within the range of between 1e14 to 1e16 atoms/cm$^2$ LDD implant for a PMOS implant using BF$_2$ with an energy within the range of between 1 to 10 keV and a dose within the range of between 1e14 to 5e15 atoms/cm$^2$.

The preferred conditions for the HVLDD implant of the invention are as follows:

for NMOS implant using boron with an energy within the range of between 40 to 70 keV and a dose within the range of between 5e12 to 1e14 atoms/cm$^2$ for PMOS implant using phosphorous with an energy within the range of between 50 to 250 keV and a dose within the range of between 5e12 to 1e14 atoms/cm$^2$.

FIG. 3b shows a cross section of the silicon substrate 10, the LV gate structure 18 is created on the surface of the substrate 10. The purpose of the cross section that is shown in FIG. 3b is to indicate that the HVLDD implant that has been performed as shown in FIG. 3a has no impact on the LV device that is shown in FIG. 3b. No further detailing of the cross section of FIG. 3b is therefore in order. The cross section that is shown in FIG. 3b therefore implies that proper shielding was applied during the HVLDD implant such that the LV gate structure is not affected during the HVLDD implant.

FIG. 4a shows a cross section of the silicon substrate with the RV gate structure after the gate structure 14 has been subjected to a thermal gate anneal. The purpose of the gate anneal is to create a protective layer of oxide that surrounds the gate structure 14 in addition to creating a layer of annealed oxide on the surface of the layer 12 of gate oxide.

The process of gate anneal that creates the layer of gate anneal oxide is performed in an oxygen—steam ambient at a temperature between about 800 and 1000 degrees C. The layer of gate oxide that is created in this manner is typically of a thickness between about 30 and 300 Angstrom. This layer of thermal oxide also overlays the layer of gate oxide 12 thereby extending the thickness of this layer 12 to between about 230 and 700 Angstrom.

FIG. 4b shows a cross section of the substrate on the surface of which a LV gate structure 18 has been created. The LV gate structure 18 has be subjected to a thermal gate anneal, this gate anneal of the LV gate structure has been performed at the same time and using the same processing conditions as the gate anneal that has been performed on the HV device as highlighted under FIG. 4a. The layer of gate oxide that is created in this manner around the LV gate structure 18 is typically of a thickness between about 15 and 100 Angstrom. This layer of thermal oxide also overlays the layer of gate oxide 16 thereby extending the thickness of this layer 16 to between about 60 and 250 Angstrom.

It must further be noted that the gate anneal, which is performed after the HVLDD has been completed, drives the HVLDD implant further into the surface of the substrate in the source/drain regions of the gate structure 14 and forms a deep and properly graded junction between the source/drain regions and the underlying silicon of the substrate. The sequence of first performing the HVLDD implant after which the gate oxide anneal is performed results in higher breakdown voltage for the HV device.

Furthermore, the layer of gate oxide is in place at the time of the gate anneal process and prevents diffusion of the HVLDD implant into the channel region of the gate structure. This has a positive effect on the threshold performance of the gate electrode by raising the threshold limit of the device.

FIG. 5a shows a cross section of the substrate after the LVLDD implant 22 has been performed on the LV device. The purpose of showing the cross section as shown in FIG. 5a is to highlight that the LVLDD implant for the LV device has no effect on the HV device. The cross section that is shown in FIG. 5a implies that proper shielding was applied during the LVLDD implant such that the HV gate structure 14 of FIG. 5a is not affected during the LVLDD implant.

FIG. 5b shows a cross section of the substrate after the LVLDD implant has been performed on the LV device.

The preferred LVLDD implant processing conditions of the invention for NMOS/PMOS devices are as follows:

LDD implant for a NMOS device using arsenic with an energy within the range of between 1 to 10 keV and a dose within the range of between 1e14 to 1e16 atoms/cm$^2$ LDD implant for a PMOS device using BF$_2$ with an energy within the range of between 1 to 10 keV and a dose within the range of between 1e14 to 5e15 atoms/cm$^2$.

The process of the invention is, with the completion of the LVLDD implant, essentially completed. The gate electrode structure can, from this point on, be completed using the conventional processing steps of completing the spacer formation, of completing source and drain region implant, of forming for instance Anti Reflective Coating on the surface of the gate structure, of saliciding the (source/drain and gate surface) surfaces, of depositing layers of dielectric or passivation and of establishing electrical contacts with the source/drain regions and the surface of the gate electrode.

These latter processing steps are well known in the art while the process of the invention does not depend on and is not influenced by these processing steps that are required to complete the gate electrode. These processing steps will therefore not be further discussed at this time and do not form part of the invention.

The structure of the polysilicon gate can, when observed from above, be of two different kinds. The first is where the structure when viewed from above shows the source and drain regions to be on opposite sides of the polygate without surrounding the poly gate. The second is where the drain is in the center of the polysilicon and surrounded by the polysilicon while the source in turn surrounds the polysilicon of the gate. For both structures the results in breakdown voltage improvements of the invention have been empirically determined and show, for the first indicated gate structure an improvement in gate breakdown voltage of the invention of approximately 4.5% for NMOS devices and 6.7% for PMOS devices. The improvements of the invention obtained for the second indicated structure is approximately 8.5% for NMOS devices and 5.6% for PMOS devices. These measurement results clearly indicate that the process of the invention achieves the objective of improving the breakdown voltage of the typical PMOS and NMOS gate electrode.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for making an integrated circuit having a low voltage device and a high voltage device, comprising the steps of:

providing a semiconductor substrate, then;

patterning said semiconductor substrate into a low voltage portion and a high voltage portion, creating a first layer of gate oxide over the surface of said high voltage portion of said substrate, furthermore creating a second layer of gate oxide over the surface of said low voltage portion of said substrate, furthermore creating at least one High Voltage polysilicon gate structure over said first layer of gate oxide and at least one Low Voltage polysilicon gate structure over said second layer of gate oxide, said at least one High Voltage polysilicon gate structure and said at least one Low Voltage polysilicon gate structure having a channel length in the micron or sub-micron region, then;

diffusing an impurity concentration into said high voltage portion, creating a High Voltage Lightly Doped Diffusion (HVLDD) region in the surface of said substrate self-aligned with said at least one High Voltage polysilicon gate structure, then;

simultaneously annealing said high voltage portion and said low voltage portion, creating a layer of gate anneal oxide over the surface of said high voltage portion and said low voltage portion, including the exposed surface of said first layer of gate oxide and said second layer of gate oxide, thereby reducing gate etch damage and providing gate sidewall protection for said at least one High Voltage polysilicon gate structure and said at least one Low Voltage polysilicon gate structure, thereby furthermore forming junctions between said High Voltage Lightly Doped Diffusion (HVLDD) region in the surface of said substrate and the underlying silicon of the substrate; and then diffusing an impurity concentration into said low voltage portion, creating a Low Voltage Lightly Doped Diffusion (LVLDD) region in the surface of said substrate self-aligned with said at least one Low Voltage polysilicon gate structure, assuring device operational requirements for said at least one Low Voltage polysilicon gate structure while maintaining high breakdown voltage requirements for said at least one High Voltage polysilicon gate structure.

2. The method of claim 1, said first layer of gate oxide created over the surface of said high voltage portion of said substrate being between about 150 and 400 Angstrom thick, said second layer of gate oxide created over the surface of said low voltage portion of said second substrate being between about 15 and 100 Angstrom thick.

3. The method of claim 1 wherein said diffusing an impurity concentration into said high voltage portion i s a self-aligned PMOS LDD implant using boron with an energy within the range of between 40 to 70 keV and a dose within the range of between 5e12 to 1e14 atoms/cm$^2$.

4. The method of claim 1 wherein said diffusing an impurity concentration into said high voltage portion is a self-aligned NMOS LDD implant using phosphorous with an energy within the range of between 50 to 250 keV and a dose within the range of between 5e12 to 1e14 atoms/cm$^2$.

5. The method of claim 1 wherein said simultaneously annealing said high voltage portion and said low voltage portion is performed in an oxygen—steam ambient at a temperature between about 800 and 1000 degrees C. to a thickness between about 30 and 300 Angstrom.

6. The method of claim 1 wherein said diffusing an impurity concentration into said low voltage portion is a self-aligned LDD implant for a NMOS device using arsenic with an energy within the range of between 1 to 10 keV and a dose within the range of between 1e14 to 1e16 atoms/cm$^2$.

7. The method of claim 1 wherein said diffusing an impurity concentration into said low voltage portion is a self-aligned LDD implant for a PMOS device using BF$_2$ with an energy within the range of between 1 to 10 keV and a dose within the range of between 1e14 to 5e15 atoms/cm$^2$.

8. A method for creating an integrated circuit having a low voltage PMOS device, a low voltage NMOS device, a high voltage PMOS device and a high voltage NMOS device, comprising the steps of:

providing a semiconductor substrate;

patterning said substrate into a Low Voltage NMOS well and a High Voltage NMOS well, creating a Low Voltage NMOS transistor within the Low Voltage NMOS well and a High Voltage NMOS transistor within the High Voltage NMOS well, said Low Voltage NMOS transistor being formed over a first layer of gate oxide having a thickness between about 15 and 100 Angstrom, said High Voltage NMOS transistor being formed over a second layer of gate oxide having a thickness between about 150 and 400 Angstrom;

patterning said substrate into a Low Voltage PMOS well and a High Voltage PMOS well, creating a Low Voltage PMOS transistor within the Low Voltage PMOS well and a High Voltage PMOS transistor within the High Voltage PMOS well, said Low Voltage PMOS transistor being formed over a layer of gate oxide having a thickness between about 15 and 100 Angstrom, said High Voltage PMOS transistor being formed over a layer of gate oxide having a thickness between about 150 and 400 Angstrom;

implanting a first type impurity into the High Voltage PMOS well, creating High Voltage Lightly Doped (HVLDD) regions in the surface of said substrate self-aligned with said High Voltage PMOS transistor;

simultaneously performing a gate anneal of said Low Voltage NMOS transistor and said High Voltage NMOS transistor and said Low Voltage PMOS transistor and said High Voltage PMOS transistor, creating a layer of gate anneal oxide over the surface of said High and Low Voltage PMOS and NMOS transistors, including the exposed surface of said first layer of gate oxide and said second layer of gate oxide, thereby reducing gate etch damage and providing gate sidewall protection for said High and Low Voltage PMOS and NMOS transistors, thereby furthermore forming junctions between the source/drain regions of said High Voltage transistors and the underlying silicon of the substrate; and implanting a second type impurity into the Low Voltage PMOS well, followed by implanting a second type impurity into said Low Voltage NMOS well, creating Low Voltage Lightly Doped (LVLDD) regions in the surface of said substrate self-aligned with said Low Voltage PMOS and NMOS transistors, assuring device operational requirements for said Low Voltage PMOS and NMOS transistors while maintaining high breakdown voltage requirements for said at High Voltage PMOS and NMOS transistors.

9. The method of claim 8 wherein said implanting a first type impurity into said High Voltage PMOS well is a self-aligned PMOS LDD implant using boron with an energy within the range of between 40 to 70 keV and a dose within the range of between 5e12 to 1e14 atoms/cm$^2$.

10. The method of claim 8 wherein said implanting a first type impurity into said High Voltage NMOS well is a self-aligned NMOS LDD implant using phosphorous with an energy within the range of between 50 to 250 keV and a dose within the range of between 5e12 to 1e14 atoms/cm$^2$.

11. The method of claim 8 wherein said simultaneously performing a gate anneal is performed in an oxygen—steam ambient at a temperature between about 800 and 1000 degrees C. thereby creating a layer of gate oxide that is of a thickness between about 30 and 300 Angstrom.

12. The method of claim 8 wherein said implanting a second type impurity into the Low Voltage PMOS and said Low Voltage NMOS well is an LDD implant for a NMOS device using arsenic with an energy within the range of between 1 to 10 keV and a dose within the range of between 1e14 to 1e16 atoms/cm$^2$.

13. The method of claim 8 wherein said implanting a second type impurity into the Low Voltage PMOS and said Low Voltage NMOS well is an LDD implant for a PMOS device using BF$_2$ with an energy within the range of between 1 to 10 keV and a dose within the range of between 1e14 to 5e15 atoms/cm$^2$.

14. A method of creating CMOS integrated circuits, comprising the steps of:

providing a semiconductor substrate;

forming a first and a second layer of gate oxide of a selected thickness over active regions of said substrate, said first layer of gate oxide having a thickness between about 155 and 400 Angstrom, said second layer of gate oxide having a thickness between about 15 and 100 Angstrom then;

forming at least one high voltage gate electrode over said first layer of gate oxide and at least one low voltage gate electrode over said second layer of gate oxide over said active regions, including defining a source and a drain region for said at least one high voltage transistor, then;

lightly doping said source and drain regions of said high voltage transistors with an impurity of a selected type, creating High Voltage Lightly Doped Diffusions in the surface of said substrate self-aligned with said at least one high voltage gate electrode then;

simultaneously annealing said high voltage transistors and said low voltage transistors thereby including the exposed surface of said first and a second layer of gate oxide, creating a layer of gate anneal oxide over the surface of said high and low voltage transistors, including the exposed surface of said first layer and second layer of gate oxide, thereby reducing gate etch damage and providing gate sidewall protection for said high and low voltage transistors, thereby furthermore forming junctions between said High Voltage Lightly Doped Diffusions and the underlying silicon of the substrate; and then lightly doping each of said source and drain regions of said low voltage transistors with an impurity of a selected type, creating Low Voltage Lightly Doped Diffusions in the surface of said substrate self-aligned with said at least one low voltage gate electrode.

15. The method of claim 14 wherein each of said high voltage and said low voltage transistors is N-channel.

16. The method of claim 15 thereby furthermore including the step of forming additional P-channel transistors and wherein said gate oxide associated with said high voltage and said low voltage transistors is contiguous with said gate oxide that is associated with said additional P-channel transistors.

17. The method of claim 14 wherein said lightly doping each of said source and drain regions of said high voltage transistors is implanting a first type impurity into a high voltage PMOS by diffusing a self-aligned PMOS implant using boron with an energy within the range of between 40 to 70 keV and a dose within the range of between 5e12 to 1e14 atoms/cm$^2$.

18. The method of claim 14 wherein said lightly doping each of said source and drain regions of said high voltage transistors is implanting a first type impurity into a high voltage NMOS by diffusing a self-aligned NMOS implant using arsenic with an energy within the range of between 50 to 250 keV and a dose within the range of between 5e12 to 1e14 atoms/cm$^2$.

19. The method of claim 14 wherein said lightly doping each of said source and drain regions of said low voltage transistors with an impurity of a selected type is a LDD implant for a NMOS device using arsenic with an energy within the range of between 1 to 10 keV and a dose within the range of between 1e14 to 1e16 atoms/cm$^2$.

20. The method of claim 14 wherein said lightly doping each of said source and drain regions of said low voltage transistors with an impurity of a selected type is a LDD implant for a PMOS device using BF$_2$ with an energy within the range of between 1 to 10 keV and a dose within the range of between 1e14 to 5e15 atoms/cm$^2$.

* * * * *